United States Patent
De Jong et al.

(10) Patent No.: US 7,900,641 B2
(45) Date of Patent: Mar. 8, 2011

(54) CLEANING DEVICE AND A LITHOGRAPHIC APPARATUS CLEANING METHOD

(75) Inventors: Anthonius Martinus Cornelis Petrus De Jong, Pijnacker (NL); Hans Jansen, Eindhoven (NL); Marco Koert Stavenga, Eindhoven (NL); Peter Franciscus Wanten, Mierlo (NL); Bauke Jansen, Deurne (NL); Johannes Wilhelmus Jacobus Leonardus Cuijpers, Roermond (NL); Raymond Gerardus Marius Beeren, Dalhem (BE); Kornelis Tijmen Hoekerd, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 363 days.

(21) Appl. No.: 11/819,959

(22) Filed: Jun. 29, 2007

(65) Prior Publication Data
US 2008/0271747 A1 Nov. 6, 2008

Related U.S. Application Data

(60) Provisional application No. 60/924,244, filed on May 4, 2007.

(51) Int. Cl.
*B08B 3/04* (2006.01)
(52) U.S. Cl. .................. 134/117; 134/135; 134/166 R
(58) Field of Classification Search .................. None
See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,405,701 A | 9/1983 | Banks et al. | |
| 4,480,910 A | 11/1984 | Takanashi et al. | |
| 4,509,852 A | 4/1985 | Tabarelli et al. | 355/30 |
| 5,039,349 A | 8/1991 | Schoeppel | |
| 5,040,020 A | 8/1991 | Rauschenbach et al. | |
| 5,121,256 A | 6/1992 | Corle et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |

(Continued)

FOREIGN PATENT DOCUMENTS

CN 1963673 5/2007

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner* — Michael Kornakov
*Assistant Examiner* — Ryan Coleman
(74) *Attorney, Agent, or Firm* — Pillsbury Winthrop Shaw Pittman LLP

(57) ABSTRACT

A cleaning tool to clean a surface of a component of a lithographic apparatus is disclosed. The cleaning tool includes a sonic transducer, a liquid supply device configured to provide liquid to a reservoir between the surface to be cleaned and the sonic transducer, and a liquid outlet configured to remove liquid provided by the liquid supply device, the cleaning tool constructed and arranged such that, in use, liquid flows into the outlet under the influence of gravity.

22 Claims, 5 Drawing Sheets

U.S. PATENT DOCUMENTS

| | | |
|---|---|---|
| 6,236,634 B1 | 5/2001 | Lee et al. |
| 6,496,257 B1 | 12/2002 | Taniguchi et al. |
| 6,600,547 B2 | 7/2003 | Watson et al. |
| 6,603,130 B1 | 8/2003 | Bisschops et al. |
| 6,649,093 B2 | 11/2003 | Van Santen et al. |
| 6,781,670 B2 | 8/2004 | Krautschik |
| 6,788,477 B2 | 9/2004 | Lin |
| 6,878,916 B2 | 4/2005 | Schuster |
| 6,897,941 B2 | 5/2005 | Almogy |
| 6,954,256 B2 | 10/2005 | Flagello et al. |
| 6,992,750 B2 | 1/2006 | Kawashima et al. |
| 7,009,682 B2 | 3/2006 | Bleeker |
| 7,014,966 B2 | 3/2006 | Pawloski et al. |
| 7,050,146 B2 | 5/2006 | Duineveld et al. |
| 7,053,983 B2 | 5/2006 | Tokita |
| 7,061,575 B2 | 6/2006 | Taniguchi et al. |
| 7,070,915 B2 | 7/2006 | Ho et al. |
| 7,075,616 B2 | 7/2006 | Derksen et al. |
| 7,081,943 B2 | 7/2006 | Lof et al. |
| 7,088,422 B2 | 8/2006 | Hakey et al. |
| 7,091,502 B2 | 8/2006 | Gau et al. |
| 7,116,395 B2 | 10/2006 | Nakamura |
| 7,145,635 B2 | 12/2006 | Kawashima |
| 7,180,574 B2 | 2/2007 | Kitaoka |
| 7,195,860 B2 | 3/2007 | Endo et al. |
| 7,199,858 B2 | 4/2007 | Lof et al. |
| 7,215,410 B2 | 5/2007 | Sumiyoshi |
| 7,221,431 B2 | 5/2007 | Ohsaki |
| 7,224,427 B2 | 5/2007 | Chang et al. |
| 7,224,434 B2 | 5/2007 | Tokita |
| 7,227,615 B2 | 6/2007 | Tokita |
| 7,242,455 B2 | 7/2007 | Nei et al. |
| 7,256,868 B2 | 8/2007 | Akamatsu |
| 7,262,422 B2 | 8/2007 | Subramanian et al. |
| 7,268,961 B2 | 9/2007 | Niwa et al. |
| 7,274,472 B2 | 9/2007 | Bischoff |
| 7,301,606 B2 | 11/2007 | Arai |
| 7,307,263 B2 | 12/2007 | Bakker et al. |
| 7,315,033 B1 | 1/2008 | Pawloski et al. |
| 7,321,415 B2 | 1/2008 | Hazelton et al. |
| 7,345,737 B2 | 3/2008 | Miyajima |
| 7,349,064 B2 | 3/2008 | Nakano |
| 7,352,434 B2 | 4/2008 | Streefkerk et al. |
| 7,362,412 B2 | 4/2008 | Holmes et al. |
| 7,365,828 B2 | 4/2008 | Takamura |
| 7,379,162 B2 | 5/2008 | Miyajima |
| 7,385,670 B2 | 6/2008 | Compen et al. |
| 7,405,417 B2 | 7/2008 | Stevens et al. |
| 7,460,207 B2 | 12/2008 | Mizutani et al. |
| 7,462,850 B2 | 12/2008 | Banine et al. |
| 7,522,259 B2 | 4/2009 | Hazelton et al. |
| 7,522,263 B2 | 4/2009 | Van Mierlo et al. |
| 7,528,929 B2 | 5/2009 | Streefkerk et al. |
| 7,528,930 B2 | 5/2009 | Tokita |
| 7,557,900 B2 | 7/2009 | Shiraishi |
| 7,589,818 B2 | 9/2009 | Mulkens et al. |
| 7,628,865 B2 | 12/2009 | Singh |
| 7,630,053 B2 | 12/2009 | Kawamura |
| 2002/0104454 A1 | 8/2002 | Verschueren |
| 2002/0163629 A1 | 11/2002 | Switkes et al. |
| 2004/0136494 A1 | 7/2004 | Lof et al. ............... 378/34 |
| 2004/0207824 A1 | 10/2004 | Lof et al. ............... 355/30 |
| 2005/0018155 A1* | 1/2005 | Cox et al. ............... 355/30 |
| 2005/0024609 A1 | 2/2005 | De Smit et al. |
| 2005/0046813 A1 | 3/2005 | Streefkerk et al. |
| 2005/0134817 A1 | 6/2005 | Nakamura |
| 2005/0155623 A1 | 7/2005 | Kume |
| 2005/0225734 A1* | 10/2005 | De Smit et al. ............... 355/30 |
| 2005/0263068 A1* | 12/2005 | Hoogendam et al. ......... 118/668 |
| 2005/0270505 A1* | 12/2005 | Smith ............... 355/53 |
| 2005/0274898 A1 | 12/2005 | Watanabe et al. |
| 2006/0028628 A1 | 2/2006 | Lin et al. |
| 2006/0050351 A1 | 3/2006 | Higashiki |
| 2006/0132731 A1 | 6/2006 | Jansen et al. |
| 2006/0232757 A1 | 10/2006 | Tani et al. |
| 2006/0250588 A1 | 11/2006 | Brandl |
| 2006/0256316 A1 | 11/2006 | Tanno et al. |
| 2007/0002296 A1 | 1/2007 | Chang et al. |
| 2007/0064215 A1 | 3/2007 | Dirksen et al. |
| 2007/0076197 A1 | 4/2007 | Koga |
| 2007/0085989 A1 | 4/2007 | Nagahashi et al. |
| 2007/0091287 A1 | 4/2007 | Chang et al. |
| 2007/0127001 A1 | 6/2007 | Van Der Hoeven |
| 2007/0146658 A1 | 6/2007 | Van Mierlo et al. |
| 2007/0172234 A1 | 7/2007 | Shigemori et al. |
| 2007/0206279 A1 | 9/2007 | Brueck et al. |
| 2007/0253710 A1 | 11/2007 | Kaneyama et al. |
| 2007/0258072 A1 | 11/2007 | Nagasaka et al. |
| 2007/0274711 A1 | 11/2007 | Kaneyama et al. |
| 2008/0002162 A1 | 1/2008 | Jansen et al. |
| 2008/0218712 A1 | 9/2008 | Compen et al. |
| 2008/0271747 A1 | 11/2008 | De Jong et al. |
| 2008/0284990 A1 | 11/2008 | De Jong et al. |
| 2009/0015805 A1 | 1/2009 | Jansen et al. |
| 2009/0025753 A1 | 1/2009 | De Jong et al. |
| 2009/0027635 A1 | 1/2009 | De Jong et al. |
| 2009/0027636 A1 | 1/2009 | Leenders et al. |
| 2009/0086175 A1 | 4/2009 | Streefkerk et al. |
| 2009/0091716 A1 | 4/2009 | Kadijk et al. |
| 2009/0174870 A1 | 7/2009 | De Jong et al. |
| 2009/0174871 A1 | 7/2009 | De Jong et al. |
| 2009/0190105 A1 | 7/2009 | De Jong |
| 2009/0195761 A1 | 8/2009 | De Graaf et al. |

FOREIGN PATENT DOCUMENTS

| | | |
|---|---|---|
| DE | 206 607 | 2/1984 |
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 300 A2 | 5/2004 |
| EP | 1 420 300 A3 | 8/2005 |
| FJ | 2007-029973 | 2/2007 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2000-323396 | 11/2000 |
| JP | 2001-091849 | 4/2001 |
| JP | 2004-193252 | 7/2004 |
| JP | 2005-072404 | 3/2005 |
| JP | 2005-079222 | 3/2005 |
| JP | 2006-134999 | 5/2006 |
| JP | 2006-310706 | 11/2006 |
| JP | 2007-088328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| WO | WO 99/49504 | 9/1999 |
| WO | WO 2004/053596 | 6/2004 |
| WO | WO 2004/053950 | 6/2004 |
| WO | WO 2004/053951 | 6/2004 |
| WO | WO 2004/053952 | 6/2004 |
| WO | WO 2004/053953 | 6/2004 |
| WO | WO 2004/053954 | 6/2004 |
| WO | WO 2004/053955 | 6/2004 |
| WO | WO 2004/053956 | 6/2004 |
| WO | WO 2004/053957 | 6/2004 |
| WO | WO 2004/053958 | 6/2004 |
| WO | WO 2004/053959 | 6/2004 |
| WO | WO 2004/055803 | 7/2004 |
| WO | WO 2004/057589 | 7/2004 |

| | | |
|---|---|---|
| WO | WO 2004/057590 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/105107 | 12/2004 |
| WO | WO 2005/010611 | 2/2005 |
| WO | WO 2005/015315 | 2/2005 |
| WO | WO 2005/024517 | 3/2005 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

M. Switkes et al., "Immersion Lithography at 157 nm", J. Vac. Sol. Technol. B., vol. 19, No. 6, Nov./Dec. 2001, pp. 2353-2356.

M. Switkes at al., "Immersion Lithography: Optics for the 50 nm Node", 157 Anvers-1, Sep. 4, 2002.

B.J. Lin, "Drivers, Prospects and Challenges for Immersion Lithography", Tsmc, Inc., Sep. 2002.

B.J. Lin, "Proximity Printing Through Liquid", IBM Technical Disclosure Bulletin, vol. 20, No. 11 B, Apr. 1978, p. 4997.

B.J. Lin, "The Paths to Subhalf-Micrometer Optical Lithography", Spie vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith at al., "Immersion Optical Lithography at 193nm", FUTURE FAB International, vol. 15, Jul. 11, 2003.

H. Kawata et al., "Fabrication of 0.2pm Fine Patterns Using Optical Projection Lithography with an Oil Immersion Lens", Jpn. J. Appl. Phys. vol. 31 (1992), pp. 4174-4177.

G. Owen at al., "1/8pm Optical Lithography", J. Vac. Sci. Technol. B., vol. 10, No. 6, Nov./Dec. 1992, pp. 3032-3036.

H. Hogan, "New Semiconductor Lithography Makes a Splash", PHOTOTONICS SPECTRA, Photonics Technology/World, Oct. 2003 Edition, pp. 1-3.

S. Owa and N. Nagasaka, "Potential Performance and Feasibility of Immersion Lithography", NGL Workshop 2003, Jul. 10, 2003, Slide No. 1-33.

S. Owa et al., "Update on 193nm immersion exposure tool", Litho Forum, International SEMATECH, Los Angeles, Jan. 27-29, 2004, Slide No. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar., 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, "The $k_3$ coefficient in nonparaxial $\lambda$/NA scaling equations for resolution, depth of focus, and immersion lithography", J. Microlith., Microfab., Microsyst. 1(1):7-12 (2002).

Korean Office Action as issued for Korean Patent Application No. 10-2008-0041294, dated Oct. 29, 2009.

* cited by examiner

Fig. 2
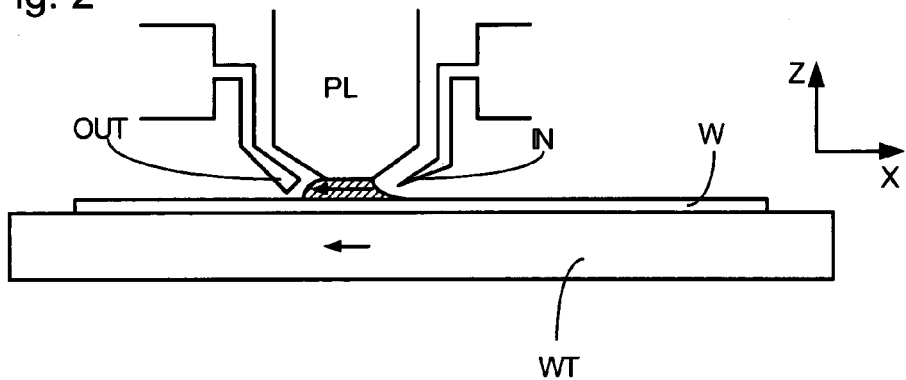
Fig. 3
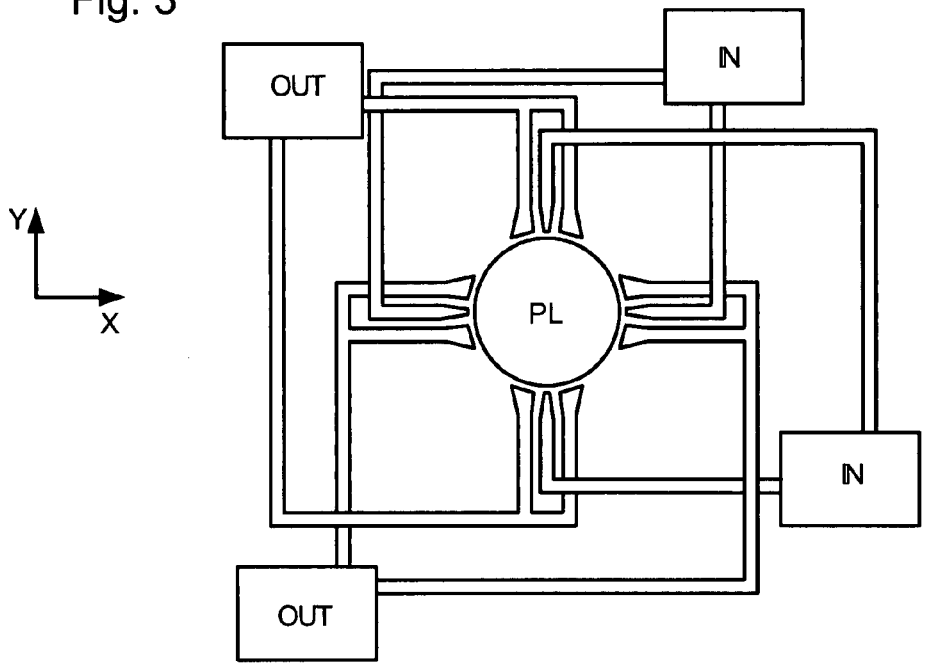
Fig. 4
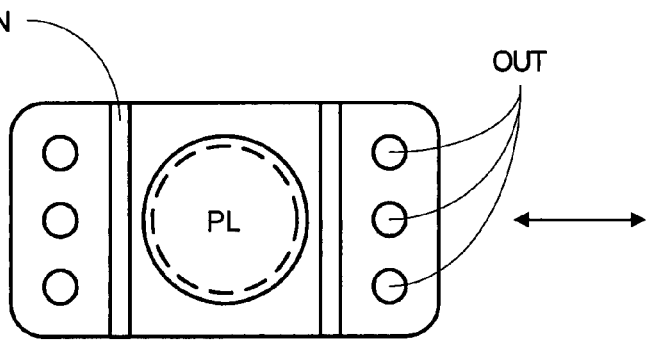
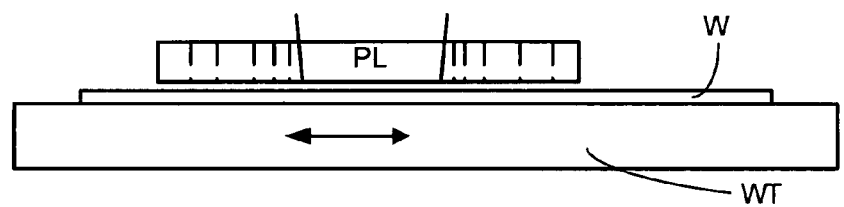

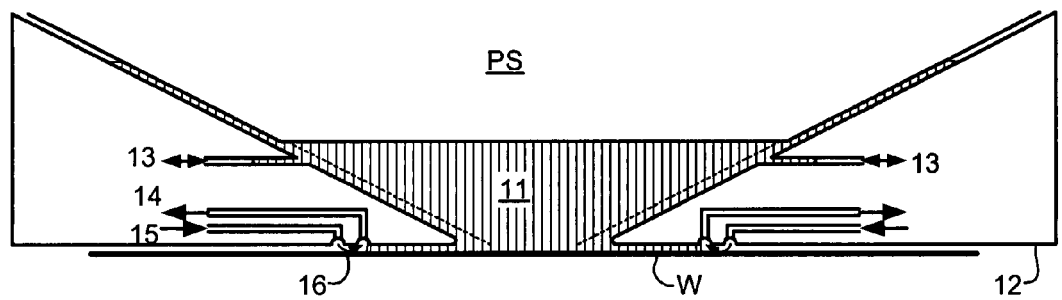
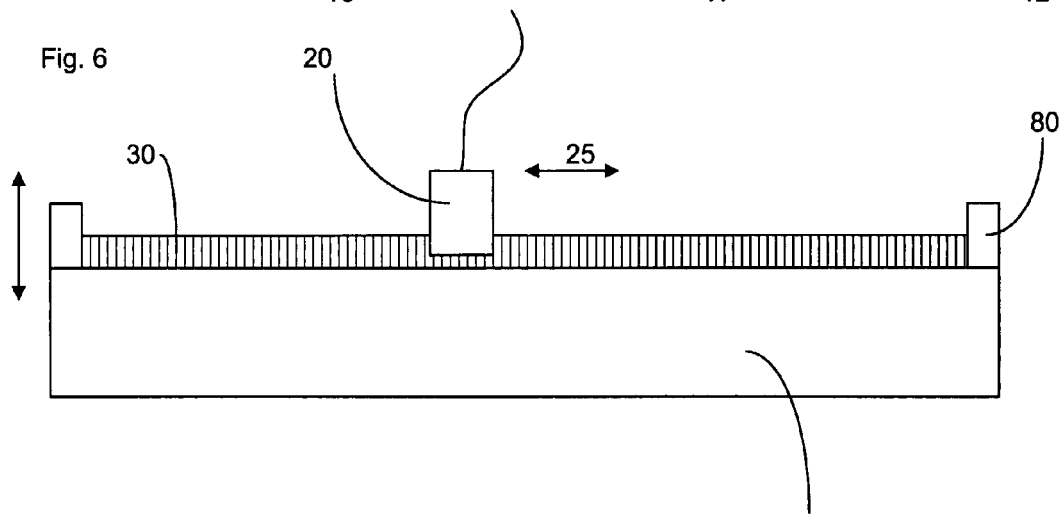
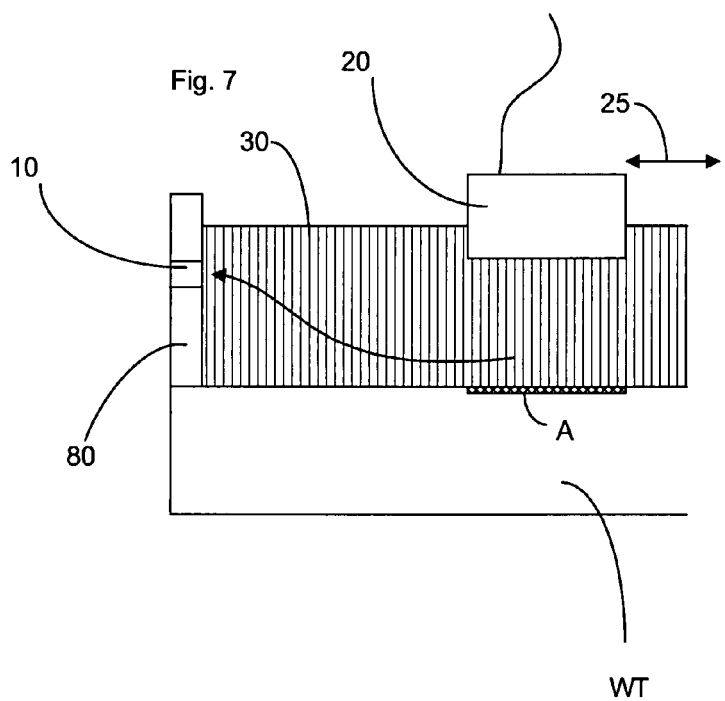

CLEANING DEVICE AND A LITHOGRAPHIC APPARATUS CLEANING METHOD

This application claims priority and benefit to U.S. Provisional Patent Application Ser. No. 60/924,244, entitled "Lithographic Apparatus and Lithographic Apparatus Cleaning Method", filed on May 4, 2007. The content of that application is incorporated herein in its entirety by reference.

FIELD

The present invention relates to a lithographic apparatus and a method for cleaning a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each of which is hereby incorporated in its entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Immersion liquid may lift debris or particles (e.g. left over from the manufacturing process) from parts of the lithographic apparatus and/or substrates or erode components so as to introduce particles. This debris may then be left behind on the substrate after imaging or may interfere with the imaging while in suspension in the liquid between the projection system and the substrate. Thus, the issue of contamination should be addressed in an immersion lithographic apparatus.

SUMMARY

It is desirable, for example, to provide a lithographic apparatus which can easily and effectively be cleaned as well as to provide a method for effectively cleaning an immersion lithographic apparatus.

According to an aspect of the invention, there is provided a cleaning tool to clean a surface of a component of a lithographic apparatus, the cleaning tool comprising: a sonic transducer; a liquid supply device configured to provide liquid to a reservoir between the surface to be cleaned and the sonic transducer; and a liquid outlet configured to remove liquid provided by the liquid supply device, the cleaning tool constructed and arranged such that, in use, liquid flows into the outlet under the influence of gravity.

According to an aspect of the invention, there is provided a method of cleaning a surface of a component, the method comprising: providing liquid between a surface of a component and a sonic wave source in a reservoir; and allowing liquid to flow out of the reservoir under the influence of gravity.

According to an aspect of the invention, there is provided an immersion lithographic projection apparatus, comprising: a sonic transducer; a liquid supply device configured to provide liquid to a reservoir between the surface to be cleaned and the sonic transducer; and a liquid outlet configured to remove liquid provided by the liquid supply device, the projection apparatus constructed and arranged such that, in use, liquid flows into the outlet under the influence of gravity.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

FIG. 5 depicts, in cross-section, another liquid supply system for use in a lithographic apparatus;

FIG. 6 illustrates, in cross-section, a design of cleaning apparatus configured to clean a substrate table;

FIG. 7 illustrates, in cross-section, part of a design of a further cleaning apparatus configured to clean a substrate table;

DETAILED DESCRIPTION

Figure 1:
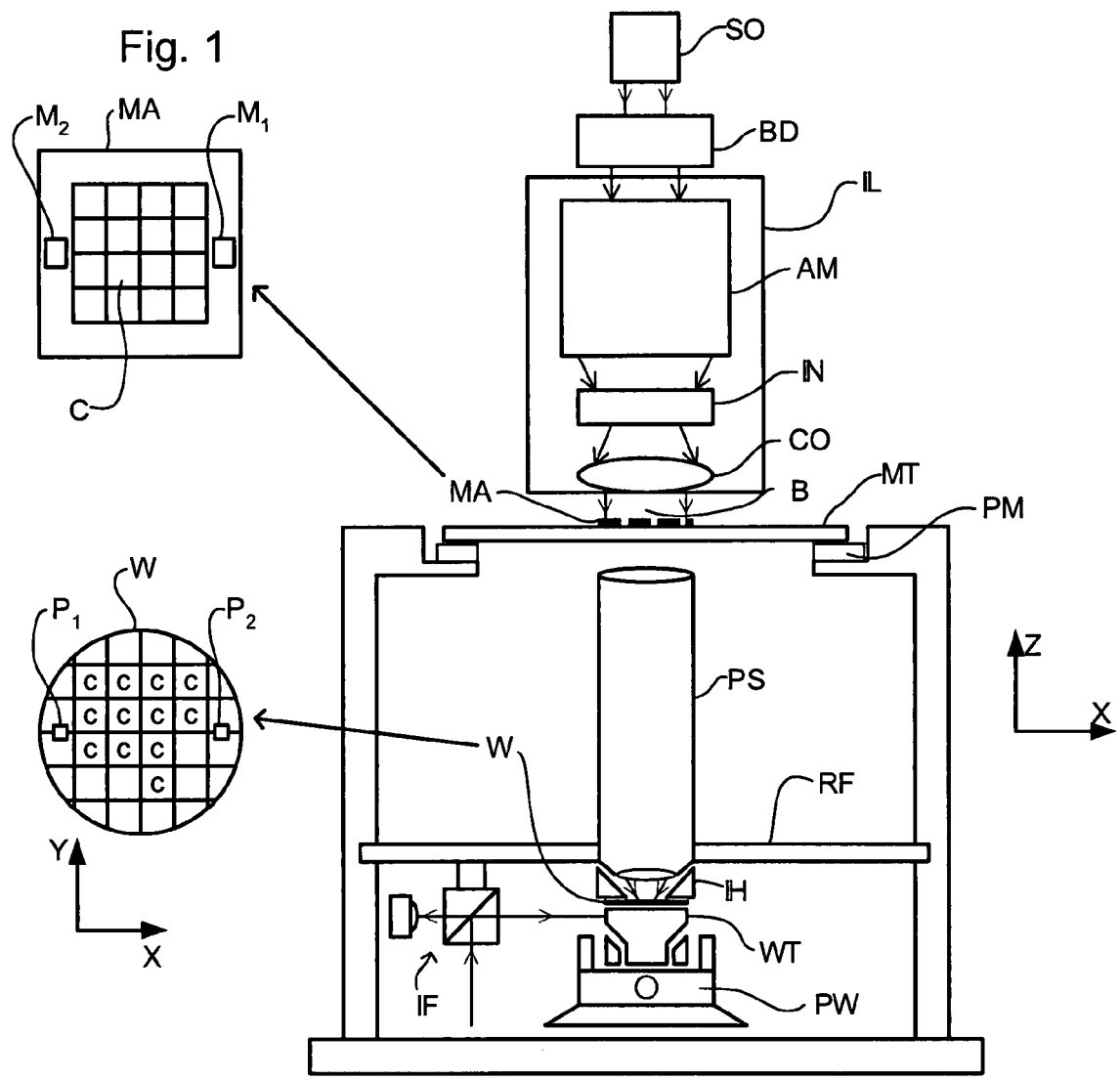
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to mask-less lithography that utilizes a programmable patterning device, such as a programmable mirror array of a type as referred to above.

Combinations and/or variations on the above described modes of use or entirely different modes of use may also be employed.

Another immersion lithography solution with a localized liquid supply system solution IH which has been proposed is to provide the liquid supply system with a barrier member that extends along at least a part of a boundary of the space between the final element of the projection system and the substrate table. Such a solution is illustrated in FIG. 5. The barrier member is substantially stationary relative to the projection system in the XY plane though there may be some relative movement in the Z direction (in the direction of the optical axis). In an embodiment, a seal is formed between the barrier member and the surface of the substrate and may be a contactless seal such as a gas seal.

The barrier member 12 at least partly contains liquid in the space 11 between a final element of the projection system PS and the substrate W. A contactless seal 16 to the substrate may be formed around the image field of the projection system so that liquid is confined within the space between the substrate surface and the final element of the projection system. The space is at least partly bounded or formed by the barrier member 12 positioned below and surrounding the final element of the projection system PS. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow inwardly that confines the liquid. Those inlets/outlets may be annular grooves which surround the space 11 and the flow of gas 16 is effective to contain the liquid in the space 11. Such a system is disclosed in United States patent application publication no. US 2004-0207824.

As noted above, an immersion lithographic apparatus is one in which a substrate is imaged through liquid. That is, an immersion liquid is provided between a final element of the projection system PS and the substrate. This arrangement may pose one or more particular problems. In particular, the liquid should be confined in the apparatus and also the liquid should be kept as free as possible of foreign object particles which may cause defects during imaging and/or by being left on the substrate surface after imaging and prior to downstream processing. Sometimes the immersion liquid includes particles in suspension deliberately.

One way of addressing the problem of foreign object particles is by applying a cleaning liquid to the surface to be cleaned and/or introducing sonic (ultra or megasonic) waves into the liquid to clean the surface. The cleaning liquid may or may not be the same as the immersion liquid. It could, for example, be ultra pure water.

Compared to ultrasonic waves, megasonic waves produce cavitation bubbles (which implode or vibrate) which are very small and therefore may go very close to the surface to be cleaned. However, there is a limit to the amount of energy which may be introduced into the liquid using megasonics. Generally whereas ultrasonic energy may be introduced into a liquid anywhere and will be distributed throughout the liquid, megasonic energy is only locally high and must therefore be directed directly to the surface to be cleaned. That is, a direct path (line of sight/straight) must be present between the transducer introducing the megasonic waves and the surface to be cleaned. The whole length of that path should be filled with liquid.

Megasonic frequencies are generally regarded to be between 750 kHz to 3 MHz. For the present purposes frequencies of above about 750 kHz, above 1 MHz or above 1.5 MHz are used.

A stagnant boundary layer in the cleaning fluid near the surface of an object to be cleaned becomes thinner as the frequency of the introduced sonic energy is increased. At megasonic frequencies cleaning is partly accomplished by megasonic pulsing and acoustic streaming with high velocity pressure waves in the cleaning fluid as well as bubble vibration and, to a lesser extent cavitation and bubble bursting.

At megasonic frequencies, particles of less than 0.5 µm in diameter may be removed without damage to the surface being cleaned. As mentioned above, there should be a clear path from the transducer to the surface being cleaned (line of sight). In order to further increase the cleaning efficiency, gas may be dissolved into the liquid to promote cavitation (bubble formation). Suitable gases include nitrogen, carbon dioxide or oxygen and mixtures of those gases (including air) but other gases may also be suitable such as ozone, or hydrogen (containing water). The use of a surfactant in the liquid can further enhance cleaning efficiency. Other possibilities to enhance cleaning efficiency include using a detergent or a solvent in the cleaning liquid or adding $H_2O_2$ solution. This boosts the oxidizing nature of the fluid, thereby helping to remove organic contamination. Another example is hypochlorite.

It is also possible to change the cleaning fluid polarity for example by adding a liquid-miscible solvent (e.g., a water-miscible solvent) with a lower polarity than the liquid (e.g., water), examples of which, include an alcohol, a ketone, an organic acid, an amine, etc. One potential problem with adding such an additive is the lower flash point of the resulting cleaning fluid. Thus, adding an organic-based additive with a high flash point in order to vary the cleaning fluid characteristics without causing a flammability hazard is desired. Such an additive may include N-methylpyrrolidone (NMP), glycol ether, etc. Of course other additives may be added to the liquid. For example, it may be desirable to add a chemical which has a specific chemical attack on one or more specific contaminants which are to be removed. For example, resist particles could be removed with a chemical such as methylethylkeytone, ethylacetate and/or acetone.

Cleaning of a surface may be performed in a multi-step way in which different contaminants are removed during different steps. Thus, in a first step, a liquid with a first specific additive is used to remove a first contaminant. Then the sonic waves are used to clean the surface through the liquid with the first specific additive. In a second step, a liquid with a second additive, different from the first additive, and designed to attack a different contaminant is used between the sonic transducer and the surface to be cleaned. Any number of these steps can be performed and it may or may not be necessary to rinse the surface between using liquids with different additives (for example, the first and second additives, which are different, may not be compatible). Such a sequential cleaning strategy can result in high overall particle removal.

Objects which one might want to clean in an immersion lithographic apparatus include, but are not limited to, one or more parts of a substrate table WT which supports the substrate W (its top surface), a final element of the projection system PS which is immersed in immersion liquid during imaging, and/or a liquid confinement system (for example those illustrated in FIGS. 2-5) which provides liquid between the final element of the projection system PS and the substrate W during imaging. Below one or more embodiments of the invention will be described in relation to cleaning the top surface of a substrate table and a barrier member, but the invention is not limited to only cleaning a substrate table and a barrier member.

In an embodiment, a liquid supply system provides liquid between a sonic transducer and the surface to be cleaned. In the embodiment, the liquid supply system provides a flow of liquid so that liquid is removed as the surface is cleaned such that particles removed from the surface are carried away. One suitable liquid is water in an ultra pure form. However, other types of liquid may be suitable. Furthermore, an addition to the liquid such as a surfactant as mentioned above may also have an advantage. Other cleaning liquids include water/hydrogen peroxide, water/ethanol, water/iso-propylalcohol (IPA), water/ammonia or water/acetone mixtures, for example. Other chemicals which may be useful as an addition include tetramethylammonium hydroxide (TMAH) and SC-1 or SC-2.

One reason for introducing gas (or some solvents) into the liquid is that this promotes stable cavitation. This results in stable bubbles being formed in the liquid. These bubbles are then vibrated by the megasonic waves which results in cleaning which is likely to do less damage to the surface being cleaned than so called transient cavitation which is cavitation where a solvent evaporates into a bubble and then implodes or collapses. These violent implosions may lead to damage of the surface and are typically seen at ultrasonic frequencies and are less significant at megasonic frequencies where the bubbles produced tend to be smaller than those produced at ultrasonic frequencies. However, as noted above, the megasonic waves should be supplied in line of sight of the surface they are to clean.

A process time up to 100 seconds may lead to a particle removal efficiency of up to 100% at a frequency of about 1 MHz. If the acoustic frequency exceeds much more than 3 MHz the particle removal efficiency may be dramatically decreased compared to a frequency of just above 1 MHz. The introduction of gas into the liquid has a major effect on the particle removal efficiency. Removal of 34 nm diameter $SiO_2$ particles may increase from zero removal efficiency to 30% removal efficiency with the introduction of oxygen at a level of 20 ppm into the liquid. Thus, a gas concentration of above about 5 ppm can be useful.

Temperature may also be significant and a balance should be drawn between faster reaction time at a high temperature (e.g., 55° C.) over less gas being dissolved at a high temperature.

There is also an effect of the pH of the liquid. At low pH, there are many $H^+$ ions in the liquid which results in a positive surface charge. Similarly, at high pH, the liquid contains many $OH^-$ ions which results in a negative surface charge. Therefore ensuring that the pH of the liquid is distant from pH 7 increases the likelihood that re-deposition of particles after they have been removed does not occur. Moreover, the electrostatic repulsion between the particle and the surface when both are charged equally (either positively or negatively) assists in lifting the particle from the surface.

The power of the transducer is desirably between 0.2 and 5 $W/cm^2$, the irradiation distance between 5 and 20 mm and cleaning time between 10 and 90 seconds. For the acoustic waves from the megasonic transducer to travel a direct path to the surface to be cleaned from the megasonic transducer, several designs are proposed to clean different parts of the immersion lithographic apparatus.

A megasonic cleaner is well suited to removing particles from a surface.

FIG. 6 illustrates an apparatus, which is used to clean, for example, the top surface of the substrate table WT, the substrate table WT comprising a retractable barrier 80 which, in its cleaning position, extends above and around the top surface of the substrate table WT to be cleaned. Once the barrier 80 has been raised to its cleaning position liquid can be provided on the surface to be cleaned and a megasonic transducer 20 can be moved (in direction 25) over the surface of the substrate table WT (with the bottom surface of the transducer 20 covered by liquid) and/or the substrate table WT may be moved under the transducer 20, thereby to clean the top surface of the substrate table WT. Of course a similar arrangement is possible where the barrier 80 is not retractable and is permanently attached to the substrate table WT or is a removable part. The transducer 20 could be fixed or moveable (particularly in the Z direction) and/or also moveable in the X/Y axis during the cleaning operation.

When the top surface of the substrate table WT is cleaned, it is also possible to clean at the same time one or more sensors provided on the top surface of the substrate table WT. Examples of types of sensors include a transmission image sensor, a lens interferometer, and/or a spot sensor.

It may be useful to ensure that the acoustic waves produced by the transducer impinge at 90° onto the surface to be cleaned. For this purpose, a micrometer may be provided to adjust the tilt of the transducer 20 relative to the surface to be cleaned. In one design of apparatus, it may be advantageous to provide the transducer tilted relative to the surface and again, this can be adjusted using a micrometer. A micrometer may also be used to adjust the distance from the transducer to the surface to be cleaned.

The issue of contamination in an immersion lithographic apparatus is, for example, addressed in U.S. patent application Ser. No. 11/437,876 filed May 22, 2006. In this application, a lithographic apparatus has a megasonic transducer configured to clean a surface easily and effectively. The megasonic transducer is well suited to removing particles from a surface. However, the particles may sometimes re-deposit and re-attach themselves to the surface being cleaned. Re-deposition readily occurs if the fluid flow is not accurately controlled which happens typically at one or more locations of zero flow velocity (stagnant zone) or at the interface of fluid and gas (e.g., air). Therefore, it is desirable to provide a flow of liquid between the megasonic transducer and the surface being cleaned. In particular, it is desirable to design the apparatus such that there are no locations of zero flow velocity (stagnant zones).

It is desirable to alleviate the aforementioned problem of particles re-attaching themselves by, for example, providing a lithographic apparatus in which the flow of cleaning fluid is effectively controlled so as to minimize the re-deposition of contaminant particles on a surface being cleaned. It is also desirable to provide a flow of liquid between the megasonic transducer and the surface being cleaned, so that the liquid in which the particles are suspended is quickly moved away. Thus the number of locations of zero flow velocity (stagnant zones) is reduced and re-deposition is avoided.

In a variation of the apparatus shown in FIG. 6, cleaning liquid 30 flows between the transducer 20 and the surface to be cleaned. FIG. 7 shows one design in which a megasonic transducer 20 is held over part of a top surface of the substrate table WT (e.g. a mirror block), defining the area A being cleaned. The lower surface of the megasonic transducer is submersed in cleaning liquid 30 held in a reservoir. Cleaning fluid 30 is extracted though one or more outlets 10 located in the surface of the reservoir, towards the side(s) of the reservoir and away from the transducer 20. As the megasonic transducer 20 is smaller than the substrate table WT to be cleaned, the transducer and/or substrate table must be moved around.

The gas/liquid (e.g. air/water) interface is especially sensitive to particle (re)deposition. As the megasonic transducer 20 is moved across the surface of the substrate table WT (and/or vice versa), the gas/liquid interface passes over critical, cleaned areas. Contaminants, some of which have been removed from the substrate table WT, can deposit on the substrate table WT surface under the gas/liquid interface, between the surface being cleaned and the one or more outlets.

Figure 8:
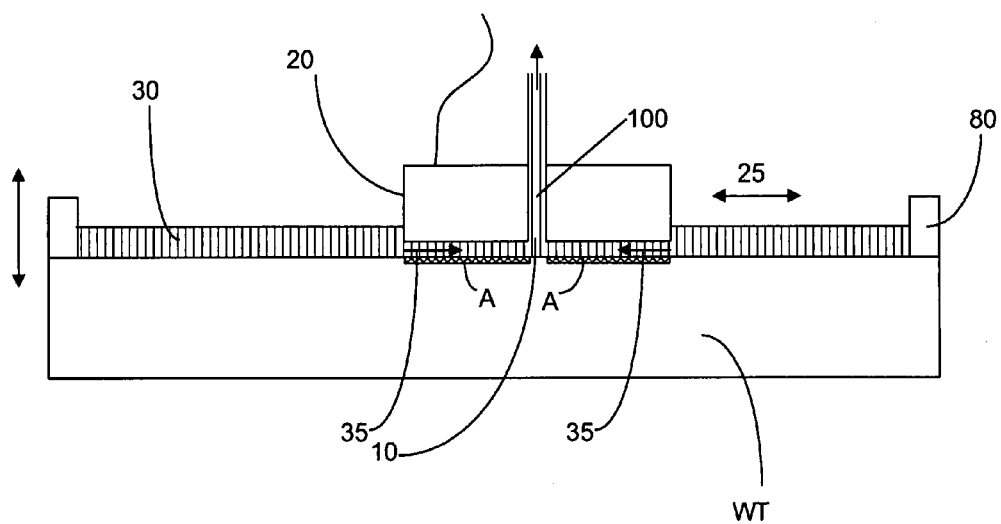
FIG. 8 illustrates, in cross-section, a cleaning apparatus to clean a substrate table.

FIG. 8 shows an apparatus in which the surface of the megasonic transducer 20 that faces the substrate table is immersed in the cleaning liquid so that there is no gas (e.g. air)/liquid interface between the transducer 20 and the substrate table WT. In this apparatus a sonic transducer 20 which may be a megasonic transducer is provided. A liquid 30 is provided on a top surface of a substrate table WT. In the illustrated apparatus a barrier 80 provided on the substrate table (and which may be removable or retractable) prevents the liquid 30 from escaping. Liquid is provided radially outwardly of the sonic transducer 20 and could, for example, be provided at a location close to the barrier 80.

It is advantageous to have a flow of liquid between the surface being cleaned and the surface of the sonic transducer 20 facing the surface to be cleaned. In particular, the movement of liquid 30 is desirably towards an area of higher concentration of particles and towards an area still being irradiated with sonic waves. This arrangement may be particularly desirable in a situation where there is a liquid/air interface. This is because contaminant particles which have been removed from the surface do not migrate towards a liquid/air interface so that the cleaning is improved. In the embodiment of FIG. 8 this is achieved by extracting liquid out through a tube or pipe 100 which passes through substantially the center of the sonic transducer 20 (or at least such that it is surrounded by sonic transducer). The sonic transducer 20 is illustrated as being a single transducer though of course it could be provided as several sonic transducers positioned adjacent to one another around a central axis which is perpendicular to the surface to be cleaned and which is co-axial with the tube 100 illustrated in FIG. 8. Of course the tube 100 could also be off-set from the central axis.

The transducer 20 has a substantially central extraction pipe 100, with an outlet 10 defined in its undersurface. The outlet 10 adjoins, is adjacent to or is next to the area A being cleaned. The other end of the pipe 100 is connected to, for example, a wet vacuum i.e. an extractor. The liquid is sucked upwards through the outlet 10, causing the cleaning liquid to flow under the transducer 20, toward the center of the megasonic transducer 20. Thus, the contaminants released from the surface of the substrate table WT are removed with the flow of liquid 30, before they can redeposit back onto the surface of the top surface of the substrate table WT that is being cleaned.

As megasonic waves are directional, cleaning is desirably localized or compartmentalized to the surface of the substrate table directly in the line of path of the megasonic waves. In the apparatus shown in FIG. 8, the surface to be cleaned is directly beneath the transducer 20. Therefore, the particle concentration in the cleaning fluid directly under the transducer 20 is high, whereas the concentration beside the transducer is low. Under the influence of the radial flow, the bulk flow of fluid is directed towards the most contaminated area, which is in the region of the extraction pipe outlet 10. The liquid 30 flowing under the transducer may exhibit radial flow.

In the arrangement shown in FIG. 8 there is advantageously no gas (e.g. air)/liquid interface present in the area of the substrate table WT being cleaned, and from the region of the substrate table being cleaned to the outlet 10 to the extraction pipe 100. This apparatus may be implemented in an off-line cleaning apparatus. To use the off-line cleaning apparatus, the cleaning apparatus is secured to the substrate table WT. The substrate table WT may be removed from the lithographic apparatus during cleaning. A variant of this apparatus may be implemented in an in-line arrangement.

In the apparatus of FIG. 8, the pipe 100 is connected to an under pressure source (wet vacuum) and this causes a radially inwardly inward flow of liquid towards the central axis which is co-axial with the tube 100. However, other types of flow may also occur, for example a whirlpool type flow in which the liquid flows (with a component) inwardly towards the axis which is co-axial with the tube 100 but not exactly radially.

Although illustrated in FIG. 8 with a pipe 100 positioned through the center of the sonic transducer 20, other arrangements are possible. For example, liquid could be extracted through the surface being cleaned itself. However, that apparatus is more suited to the instance where the position of the sonic transducer 20 is fixed relative to the surface A to be cleaned. As will be appreciated, when cleaning the top surface of the substrate table WT with a sonic transducer 20 which is smaller, in plan, than the top surface of the substrate table, the sonic transducer 20 may be moved relative to the substrate table WT as illustrated by arrow 25 (and/or vice versa) so that the whole of the top surface of the substrate table WT can be cleaned.

What is desirable is the inward flow 35 of liquid from an area of low concentration of contaminant particles towards an area of high concentration of particles. An area of low concentration of particles includes an area radially outwardly from the central axis of the sonic transducer 20 where the sonic waves are not detaching particles from the surface A being cleaned. An area of high concentration of particles includes an area such as between the sonic transducer 20 and the surface A being cleaned. In this way clean liquid is replenishing contaminated liquid rather than the other way around. Furthermore, particles which have been removed from the surface to be cleaned may reattach themselves. With a radially inward flow, such particles will reattach themselves in a position radially inwardly of where they were originally attached. Geometrically the position of re-attachment should therefore be under the transducer 20 i.e. in an area where they can be again removed by the sonic waves from the sonic transducer 20.

What is desirable is the generation of the inward flow and not how this is achieved. One or more particular embodiments have been described above though of course the skilled person would be aware that other arrangements are possible and that the tube 100 does not necessarily need to pass directly through the center of the megasonic transducer 20 or a plurality of megasonic transducers forming the overall transducer 20. For example, a tube could pass through the liquid 30 to a position at which it is desired to extract liquid thereby to induce the inward flow.

Figure 9:
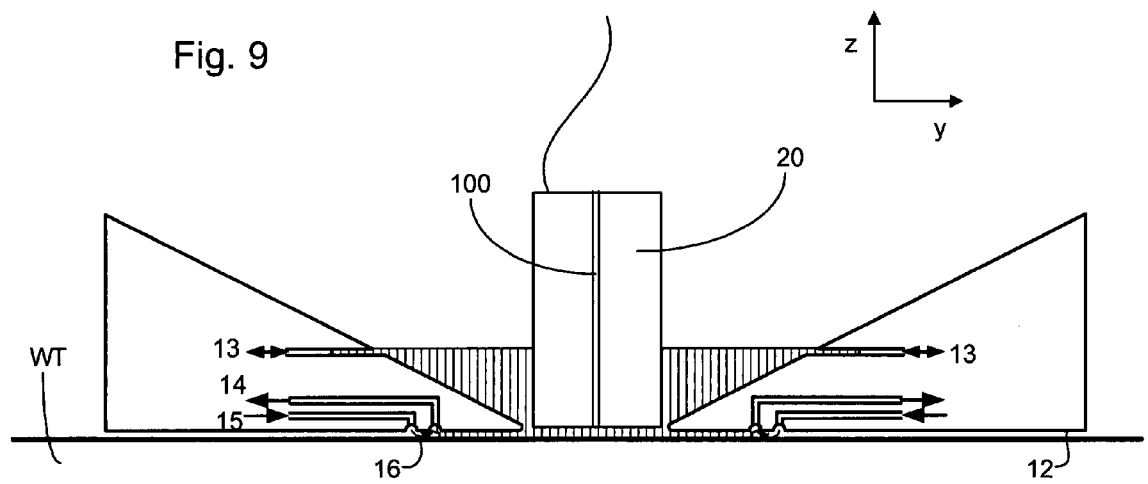
FIG. 9 illustrates, in cross-section, a further apparatus to clean a substrate table.

FIG. 9 shows an embodiment which does away with the barrier 80 of the embodiment of FIG. 8 and is more suitable for use in-line (i.e., in an immersion lithographic apparatus) than the embodiment of FIG. 8. In this embodiment the sonic transducer 20 is similar to that illustrated in FIG. 8 (except it has a smaller area, in plan). The sonic transducer 20 is surrounded by a barrier member 12 described above in relation to FIG. 5. This barrier member 12 can then be moved in the X-Y plane relative to the top surface of the substrate table WT (or vice versa) while liquid is provided between the sonic transducer 20 and the surface to be cleaned. In this embodiment the liquid is still being extracted out through tube 100, to provide the desired inward flow of liquid. A higher flow rate of liquid may therefore be required than during imaging as described with regard to FIG. 5.

The substrate table WT and/or transducer 20 are moved relative to one another so that all of the top surface of the substrate table WT may be cleaned. The cleaning could take place within the lithographic apparatus in an automated way or could be carried out manually by moving the transducer 20 relative to the top surface of the substrate table WT (and/or vice versa) by hand or by some tooling.

If the cleaning process is automated, one way of arranging for this is to have the transducer 20 be moveable from a stationary storage position to a (stationary) cleaning position and to move the substrate table WT relative to the transducer 20 when the transducer is in the (stationary) cleaning position. The substrate table WT may need to be moved in the Z axis prior to activation of the liquid supply system of the cleaning device. Once the gas flow 16 has been created the barrier member 12 is supplied with liquid and the substrate table WT is moved in the X-Y plane so that the surface which is desired to be cleaned can be cleaned.

A flow of liquid across the distance between the transducer and the surface to be cleaned is desirable though not essential.

Another way to prevent or at least reduce re-attachment of the particles to the surface is to change one or more properties of the liquid between the transducer and the surface to ensure that the zeta potential of the particles and the zeta potential of the surface is such that the particles are not attracted to the surface, desirably such that they are repelled from the surface.

The zeta potential is the potential of a surface in a liquid. The zeta potential generally decreases with distance from the surface. A given type of material has a given zeta potential for a particular type of liquid. One way of varying the zeta potential of a surface is to change the concentration of electrolyte in the liquid and an alternative or further method to change the zeta potential is to change the pH of the liquid. By careful selection of the concentration of electrolyte in the liquid (e.g. salt) and/or the pH of the liquid, (i) the zeta potential of the surface from which the particles are removed (and/or any other surface where adherence is to be avoided) and (ii) the zeta potential of the particles can be chosen. Desirably those two zeta potentials may be chosen such that they have the same polarity and thus each or one of the objects that has a respective zeta potential may repel from the other.

The pH of the liquid and/or concentration of the electrolyte can be chosen with a knowledge of the material of which the surface which is being cleaned is made and with a knowledge of the type of material of which the particles are likely to be made. If the materials are the same, then it should be easy to select a pH and/or electrolyte concentration at which the zeta potential is non-zero for both the surface and the particle. In that circumstance the potential would be either positive or negative for both the surface and the particle such that they would repel one another and the particles would be unlikely to re-adhere to the surface. If the materials are different, pH and/or electrolyte concentration may be harder to choose, but it is likely that there will be at least one pH and/or electrolyte concentration at which the zeta potential will have the same polarity for both materials.

Changing the pH of the liquid may have a negative impact on the solubility of materials, which can itself result in contamination or loss of material integrity. If this is deemed a problem it may be desirable to change the electrolyte concentration rather than the pH. If this is done by adding a well chosen salt (e.g. NaCl) then this may not greatly affect the pH of the liquid (i.e. the liquid remains neutral).

The use of two or more of the above techniques in combination (in particular changing pH and/or electrolyte concentration to change zeta potentials and the use of a surfactant) may be the best approach.

A problem encountered in cleaning a liquid confinement system LCS, such as an immersion hood (see e.g. FIG. 5), is that the megasonic waves may heat up a (final) optical element of the projection system if the cleaning takes place in-situ from below. This is because part of the projection system PS is exposed from underneath because an aperture 200 is made through the liquid confinement system LCS. The aperture 200 is, during imaging of a substrate, filled with liquid and the projection beam PB passes through the aperture 200 onto the substrate W. It is therefore desirable to clean a surface of the liquid confinement system LCS without heating the optical element, typically a WELLE lens, and without dispersing energy in the optical element. As previously shown in U.S. patent application Ser. No. 11/802,082 filed May 18, 2007, claiming priority from U.S. patent application Ser. No. 11/437,876, a gas (e.g., air) gap may be used as a shield to insulate the optical element from megasonic waves. However, liquid can, under certain conditions, enter that gap.

In an embodiment, a shield, desirably comprising a plate, may be used to shield the final element of the projection system from megasonic waves and/or liquid. Desirably the shield is a solid barrier 310 between the transducer 20 and the part of the projection system PS which is exposed through the aperture 200. In an embodiment, the shield is a physical presence (barrier) in all straight paths from the transducer 20 to the aperture 200. The barrier and/or gas gap 75 (which the barrier helps to maintain) are effective to reflect sonic vibrations from the transducer 20 away from the aperture 200. In an embodiment, the barrier 310 also seals the aperture 200 so that no liquid enters the aperture 200. This helps ensure the integrity of the gas gap and that no liquid contacts the surface of the optical element.

Figure 10:
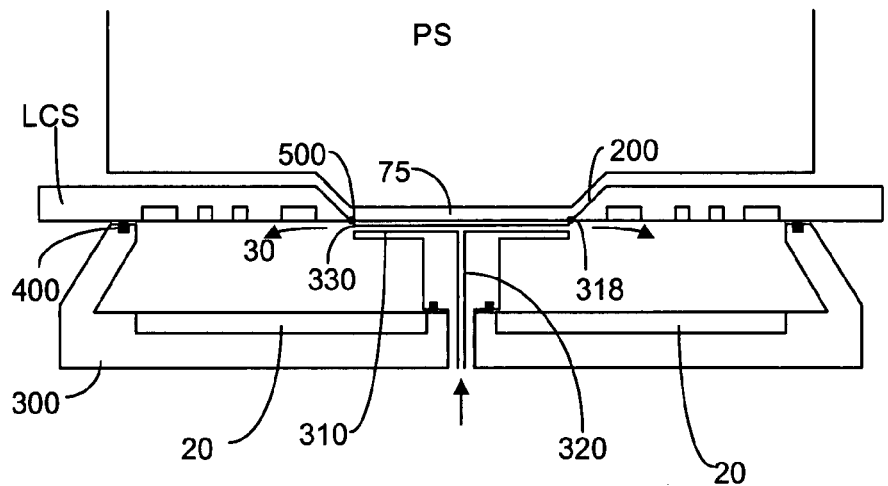
FIG. 10 illustrates, in cross-section, a cleaning apparatus to clean a liquid confinement system.

FIG. 10 shows a cleaning tool that can be secured to the underside of the liquid confinement system LCS. Note that the apparatus is, in plan, generally circular but that an embodiment of the invention may work with any type of liquid confinement system, even those which are not circular. The tool is secured to the liquid confinement system LCS by an outer sealing 400 that seals a cleaning tool body 300 to the undersurface of the liquid confinement system LCS. The outer sealing 400 is typically an O-ring. The outer sealing defines the maximum surface of the underside of the liquid confinement system LCS to be cleaned. Within the tool body 300 is a megasonic transducer 20 which is arranged to direct megasonic waves at the undersurface of the liquid confinement system LCS. Cleaning fluid fills the space between the tool body 300 and the undersurface of the liquid confinement system LCS, and so forms a reservoir.

The cleaning apparatus has a shield that in addition to a gas gap 75 between the top surface of the reservoir and the optical element comprises a barrier 310 that forms a solid separator between the transducer 20 and the gap 75. The barrier 310 improves the effectiveness of the shield by reflecting megasonic waves away from the optical element. The barrier 310 is in the form to act functionally as an umbrella to the optical element, i.e. to shield the optical element from liquid. The umbrella covers an aperture 200 defined by an inner rim 318 formed in the liquid confinement system LCS around the aperture 200 and is secured to the liquid confinement system LCS by an inner sealing 500, typically an O-ring, between the barrier 310 (umbrella) and the liquid confinement system LCS. The inner sealing 500 prevents cleaning liquid from entering the gap 75 to compromise the performance of the gap 75.

The cleaning tool also comprises a tube 320 which is attached to the barrier 310. The tube passes through the tool body 300. The tube has an inlet 330 to supply cleaning liquid into the reservoir. The inlet is located near or adjacent the top of the cleaning liquid reservoir, near the inner rim 318 formed in the liquid confinement system LCS. The inlet 330 is provided as a single slit or as a plurality of discrete holes around the outer edge of the barrier 310 such that a flow of liquid is provided in all radial directions. Formed in the undersurface of the liquid confinement system LCS is an outlet 10 connected to an under pressure source (e.g., a wet vacuum) to remove cleaning fluid. The outlet 10 adjoins, is adjacent to, or is next to, the surface of the liquid confinement system LCS to be cleaned and is a feature already present on conventional liquid confinement system (e.g., outlet OUT in any of FIGS. 2-4 and/or outlet 14 in FIG. 5). So, in use, cleaning liquid flows between the tool body and the liquid confinement system LCS, toward the outlet. Thus, this embodiment also provides a flow of liquid past the surface being cleaned. The flow of liquid is radial but in this embodiment the flow is generally outwardly. However, because the transducer 20 does not move relative to the surface to be cleaned, that is not so important in this embodiment.

The cleaning tool may be implemented an in-line or off-line arrangement. If implemented in an off-line arrangement, the liquid confinement system LCS may be removed from the lithographic apparatus for fitment to the cleaning tool.

The apparatus shown in FIG. 10 may encounter one or more problems. A source of potential instability is the under pressure in the cleaning tool, i.e. the connection of the outlet 10 to the under pressure. The suction may vary and is difficult to control because of bubble formation and pressure variation. If the under pressure is too large, bubbles form within the cleaning bath. The bubbles compromise the performance of the megasonic transducer 20. If a surfactant and/or detergent is used in the liquid, foaming may occur—see below. If the under pressure is too small, pressure builds up within the apparatus, causing cleaning liquid to flow through existing passages in the liquid confinement system LCS and so flood the gas gap 75.

The seal 500 between the tool and the liquid confinement system LCS may deteriorate, allowing liquid to leak into the gap 75. Once cleaning liquid contacts the optical element, the optical element may absorb megasonic waves and may heat-up. Mechanical damage by the megasonic energy may be an issue. For these reasons the performance of the gas gap as an insulating shield of temperature and of megasonic waves may be compromised.

A further or alternative problem with the inner seal 500 is that the design of the cleaning tool is defined by the size of the barrier 310 (umbrella) required for the inner seal 500 to function. The cleaning tool may not be generic and so different designs of cleaning tool may be required for different designs of liquid confinement system LCS. Also, there may be one or more apertures in a liquid confinement system LCS open to the underside of the liquid confinement system LCS and also in fluid communication with the aperture 200. It is possible for liquid to migrate through these one or more apertures through the liquid confinement system LCS into the gap 75. Once there, there may be no way in which to remove that liquid in the embodiment of FIG. 10.

The apparatus may comprise an additive supply device configured to add an additive to the liquid in the reservoir. Although the addition of an additive (e.g. a surfactant and/or detergent) to the cleaning liquid, such as ultra-pure water, may improve cleaning, the additive may cause a problem. In a wet vacuum system, the cleaning liquid is agitated which may cause the cleaning liquid to foam. Foaming is a problem because certain components of the lithographic apparatus, such as sensors, can be damaged on contact with foam. The foam may cause the lithographic apparatus to malfunction or cause further problems for the fabrication environment. The problem may be enhanced by the use of a re-cycling loop in the wet vacuum generator. If a lower pressure is used than that provided by the wet vacuum, this allows pressure within the reservoir to build-up such that the leaking of liquid through one or more apertures into the gap 75 mentioned above may be more likely to occur.

Figure 11:
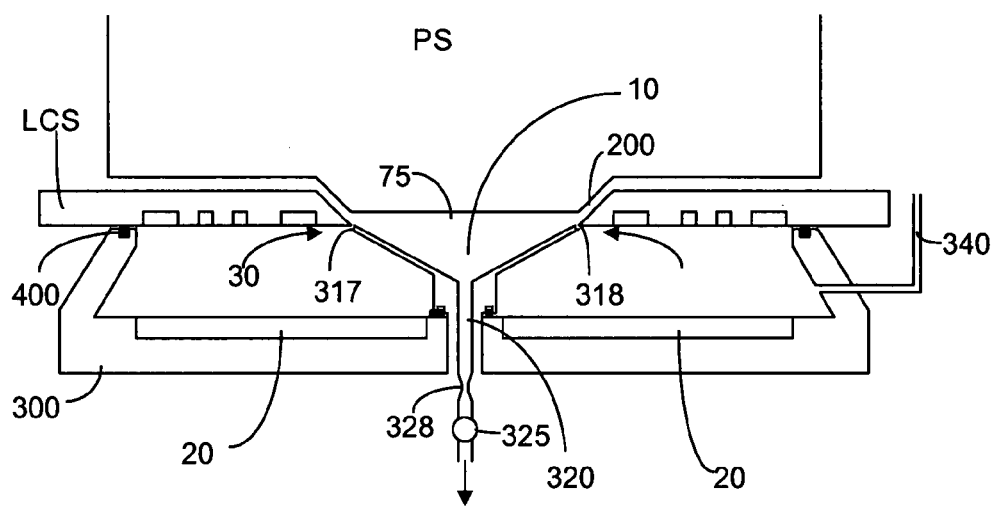
FIG. 11 illustrates, in cross-section, a further cleaning apparatus to clean a liquid confinement system.
Figure 12:
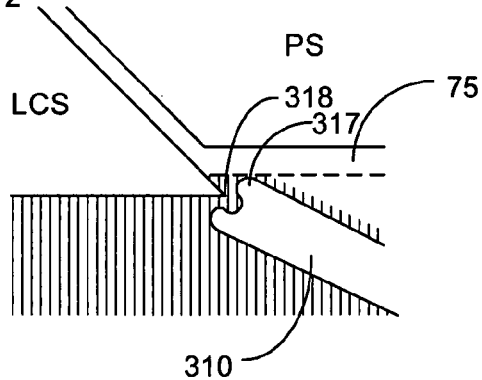
FIG. 12 illustrates, in cross-section, a detail of the embodiment of FIG. 11.

Shown in FIGS. 11 and 12 is a further embodiment of the cleaning tool fitted to the undersurface of a liquid confinement system LCS. It has some of the same features as the tool shown in FIG. 10 with the following modifications. The liquid 30 flows in the opposite direction through the reservoir and the barrier 310, so the open aperture in the barrier 310 serves as an outlet 10. The rim 317 of the open aperture of the barrier 310 adjoins, is adjacent to, or is next to, the undersurface of the liquid confinement system LCS to be cleaned. There is sufficient clearance between the inner rim 318 of liquid confinement system LCS and the barrier 310 for the cleaning liquid 30 to flow from the cleaning reservoir into the outlet 10 defined by the open aperture of the shield 310.

The barrier 310 serves as an umbrella and is funnel-shaped (or in other words a truncated cone shape in the reservoir). This shape together with the other features of this cleaning tool may improve the effectiveness of the insulating shield in that, in use, megasonic waves are reflected away from the optical element at a different angle to the angle at which they impinge on the shield. The liquid 30 flows over the rim 317 of the barrier 310 and down, into the outlet 10 and into an outflow tube 320, under the influence of gravity. Thus, the barrier 310 provides an outlet 10 through which liquid exits the reservoir under gravity. Thus, the system can be seen as being an open system (compared with the embodiment of FIG. 10 which may be seen as a closed system). Furthermore, the funnel shape of the outlet 10 and tube 320 results in a gentle flow of liquid out of the reservoir. This is particularly because of the funnel shape of the aperture and tube 320 so that liquid runs down the inclined surface of the aperture to the start of the tube part of the outlet. In this way little force is applied to the liquid to reduce the chance of foaming. Extracting liquid from the center of the reservoir results in a radial flow which in this case is radially inwardly as in the embodiment of FIGS. 8 and 9. A liquid inlet is provided and this can be provided in the tool body 300 and/or in a surface of the liquid confinement system LCS.

The rim 317 can be provided with a cross-sectional variation or shape that complements inner rim 318 of the liquid confinement system LCS, so that the flow path of cleaning liquid 30 out of the reservoir is curved or otherwise changes direction (i.e. is not straight) as it passes through the space that separates the rim 317 from the inner rim 318. See FIG. 12. This may prevent megasonic waves from entering the aperture 200. Alternatively or in addition, the cross-sectional variation or shaping can be provided on the inner rim 318 of the liquid confinement system LCS, so as to compliment the shape of the rim 317. The height of the top of the rim 317 along with the hydrostatic pressure in the reservoir determines the size of the gap 75.

The flow of liquid may be assisted by a 'slow' pump 325 (connected to the outlet 10) that provides a small underpressure to avoid the generation of bubbles in the liquid. A typical flow rate is between 0.5 and 3 liters/minute. In an embodiment, the liquid flow does not pass through a wet vacuum. Between the funnel-shaped barrier 310 and the slow pump may be a restriction 328 (i.e. a flow restrictor), desirably, in the outflow tube 320. The restriction helps minimize the formation of foam.

In an embodiment, the pressure used to cause liquid to flow through the cleaning tool is always the same. The pressure is determined by the difference in height between the rim 317 of the funnel-shaped barrier 310 and an inlet to supply cleaning liquid 30 into the reservoir. In an embodiment, the cleaning apparatus is a stable system because the pressure required to operate the cleaning apparatus is automatically controlled. Thus, the risk of flooding the gap 75 is reduced so that the gap 75 is more stable. The tool may provide an effective insulating shield for the optical element from temperature variation and/or megasonic waves.

A feature that provides improved safety and further control is a tube 340 that can be provided parallel to the funnel-shaped barrier 310 and in fluid communication with the reservoir which can be used as an indicator. The level of liquid in the tube 340 is the same as the level of liquid in the reservoir and therefore a judgment can be made as to whether the gas gap 75 is large enough. The indicator can show if there is a blockage in the tube in the barrier 310 that could cause the gas gap 75 to flood with cleaning fluid 30.

An advantage of the consistent pressure in the tool may be to reduce the quantity of bubbles formed within the reservoir. The effectiveness of the megasonic transducer may increase as a result.

As the cleaning liquid flows smoothly through the cleaning tool, there may be less gas/cleaning liquid contact than in known wet vacuum systems. Therefore, foaming within the cleaning tool may be reduced. This enables an additive (surfactant and/or detergent) to be added to the cleaning fluid that would normally foam excessively and so may usually be prohibited from use. The projection apparatus may comprise an additive supply device configured to add an additive to liquid in the reservoir.

Note that, in an embodiment, the system is open instead of closed. Therefore, there is no need for an inner seal (there is still an outer seal). This may provide an advantage. In the FIG. 10 apparatus, the umbrella 310 was dimensioned to fit the aperture 200 formed in the liquid confinement system LCS. Therefore slightly different designs of cleaning tool, and completely different process settings, may be required for different types of liquid confinement system LCS. The cleaning apparatus of FIGS. 11 and 12 may be used with several types of liquid confinement system LCS, using fixed process settings.

The cleaning tool shown in FIGS. 10 to 12 may be modified so that the cleaning fluid 30 exhibits radial flow.

Furthermore, it will be appreciated that the idea of draining cleaning liquid away from a reservoir in a cleaning tool under gravity in order to avoid foaming can be used in any type of cleaning tool and not just the type illustrated in FIGS. 11 and 12. In particular, the same idea (i.e. providing an outlet constructed and arranged to allow liquid to flow out of it under gravity) may be applied to the apparatus of FIGS. 6-8, though that may (but not necessarily) mean that the radial flow feature of those apparatus is sacrificed.

Attaching the megasonic cleaning tool to the liquid confinement system LCS and activating the transducer 20 will induce vibrations (e.g., in the MHz range) to the portion to be cleaned. Vibrations in this range may cause bubble cavitation, megasonic pulsing, and acoustic streaming, which together can be the basis for megasonic cleaning. Notably, the supply of cleaning liquid 30 is provided in such a way that the optical element is protected against megasonic energy and the cleaning fluid is introduced in such a way that negative effects (like bubbles, particle re-deposition, and/or foaming) in the apparatus are avoided.

The exemplary fluid supply configurations may improve product yield, for example, by improving the cleanliness of the lithographic apparatus which, in turn, contributes to reduction in defectivity levels.

All embodiments may be implemented off-line. There may be in-line implementations of the embodiments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components. Thus, a lens is an optical element and in an embodiment, the optical element is a lens.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The invention can be performed under the control of a controller, perhaps programmed by the above mentioned computer program.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A cleaning tool to clean a surface of a component of a lithographic apparatus, the cleaning tool comprising:
   a sonic transducer;
   a liquid supply device configured to provide liquid to a reservoir between the surface to be cleaned and the sonic transducer; and
   a liquid outlet configured to remove liquid provided by the liquid supply device, the cleaning tool constructed and arranged such that, in use, liquid flows into the outlet due to the influence of gravity, the liquid outlet being a physically separate structure from a liquid confinement structure configured to confine liquid between a projection system and a substrate table of the lithographic apparatus during projection of a patterned beam onto a substrate and the liquid outlet positioned substantially in the center of an area to which the liquid is provided by the liquid supply device to encourage a radial flow of liquid past the surface.

2. The cleaning tool of claim comprising a rim over which, in use, liquid flows to enter the outlet.

3. The cleaning tool of claim 2, wherein the plan diameter of the outlet increases with distance from the transducer.

4. The cleaning tool of claim 1, wherein the outlet is funnel shaped.

5. The cleaning tool of claim 1, wherein at a top portion, the outlet has a side inclined to vertical such that, in use, liquid flows down the side.

6. The cleaning tool of claim 1, wherein the outlet is attached to an under pressure source such that, in use, liquid flows through the outlet at a rate of between 0.5 and 3 liters per minute.

7. The cleaning tool of claim 1, further comprising an inlet to supply liquid and a controller configured to control liquid pressure in the inlet and thus height of liquid in the reservoir.

8. The cleaning tool of claim 1, further comprising a channel, in liquid communication with the reservoir, to provide an indication of the level of liquid in the reservoir.

9. The cleaning tool of claim 1, wherein the outlet is in a barrier which is designed to provide a shield to sonic waves between a delicate component and the sonic transducer.

10. The cleaning tool of claim 9, arranged to clean a liquid confinement structure which has an aperture in the surface to be cleaned, the barrier covering the aperture.

11. The cleaning tool of claim 10, wherein a rim of the outlet is sized and shaped to be distal from a rim of the aperture and such that a flow path between the rim of the outlet and the rim of the aperture is curved or otherwise changes direction.

12. The cleaning tool of claim 11, wherein, in use, liquid flows between the rim of the outlet and the rim of the aperture.

13. The cleaning tool of claim 12, wherein a flow path for the liquid flowing between the rim of the outlet and the rim of the aperture is not straight.

14. An immersion lithographic projection apparatus, comprising:
a sonic transducer;
a liquid supply device configured to provide liquid to a reservoir between a surface to be cleaned and the sonic transducer; and
a liquid outlet configured to remove liquid provided by the liquid supply device, the projection apparatus constructed and arranged such that, in use, liquid flows into the outlet due to the influence of gravity, the liquid outlet being a physically separate structure from a liquid confinement structure configured to confine liquid between a projection system and a substrate table of the immersion lithographic projection apparatus during projection of a patterned beam onto a substrate and the liquid outlet positioned substantially in the center of an area to which the liquid is provided by the liquid supply device to encourage a radial flow of liquid past the surface.

15. The projection apparatus of claim 14, further comprising an additive supply device configured to add an additive to liquid in the reservoir.

16. The projection apparatus of claim 15, wherein the additive is a surfactant and/or a detergent.

17. The projection apparatus of claim 14, comprising a rim over which, in use, liquid flows to enter the outlet.

18. The projection apparatus of claim 14, wherein the liquid supply device comprises the liquid confinement structure.

19. The projection apparatus of claim 14, wherein at a top portion, the outlet has a side inclined to vertical such that, in use, liquid flows down the side.

20. The projection apparatus of claim 14, wherein the outlet is in a barrier which is designed to provide a shield to sonic waves between a delicate component and the sonic transducer.

21. The projection apparatus of claim 20, wherein the liquid confinement structure has an aperture and the barrier is sized to cover the aperture.

22. The projection apparatus of claim 20, wherein the liquid confinement structure has an aperture and, in use, liquid flows between a rim of the outlet and the rim of the aperture.

* * * * *

UNITED STATES PATENT AND TRADEMARK OFFICE
CERTIFICATE OF CORRECTION

PATENT NO. : 7,900,641 B2  Page 1 of 1
APPLICATION NO. : 11/819959
DATED : March 8, 2011
INVENTOR(S) : Anthonius Martinus Cornelis Petrus De Jong et al.

It is certified that error appears in the above-identified patent and that said Letters Patent is hereby corrected as shown below:

On the title page, item [56]:
On page 2, column 2, item (56) References Cited - U.S. Patent Documents
after "2007/0206279 A1 9/2007 Brueck et al."
insert --2007/0247600 A1 10/2007 Kobayashi et al. --.

On page 2, column 2, item (56) References Cited - Foreign Patent Documents
replace "FJ 2007-029973"
with --JP 2007-029973--.

Signed and Sealed this
Tenth Day of May, 2011

David J. Kappos
*Director of the United States Patent and Trademark Office*